United States Patent [19]
Swanson, Jr.

[11] Patent Number: 5,175,518
[45] Date of Patent: Dec. 29, 1992

[54] WIDE PERCENTAGE BANDWIDTH MICROWAVE FILTER NETWORK AND METHOD OF MANUFACTURING SAME

[75] Inventor: Daniel G. Swanson, Jr., Mountain View, Calif.

[73] Assignee: Watkins-Johnson Company, Palo Alto, Calif.

[21] Appl. No.: 778,303

[22] Filed: Oct. 15, 1991

[51] Int. Cl.⁵ ............................................. H03H 7/00
[52] U.S. Cl. .................................... 333/168; 333/184; 333/185; 361/328
[58] Field of Search .................. 333/12, 32, 167, 168, 333/184, 185, 238, 246, 204; 361/303, 312, 313, 328, 330

[56] References Cited
U.S. PATENT DOCUMENTS

| | | | |
|---|---|---|---|
| 3,492,440 | 1/1970 | Cerbone et al. | 361/330 |
| 3,731,218 | 5/1923 | Saunders et al. | 333/216 X |
| 3,836,830 | 9/1974 | Akopian et al. | 361/330 |
| 4,881,050 | 11/1989 | Swanson, Jr. | 333/185 |

FOREIGN PATENT DOCUMENTS 1220567  1/1971  United Kingdom ............... 361/328

Primary Examiner—Paul M. Dzierzynski
Assistant Examiner—Seung Ham
Attorney, Agent, or Firm—Thomas E. Schatzel

[57] ABSTRACT

A high percentage bandwidth microwave filter network, according to an embodiment of the present invention, comprises a T-network of capacitors implemented with thin-film techniques by applying a groundplane to one side of an alumina substrate and a first plate to the other side. A silicon nitride dielectric layer having a high density of capacitance is deposited over the first plate, and then a second and third capacitor plate are deposited on the dielectric over the first plate.

6 Claims, 3 Drawing Sheets

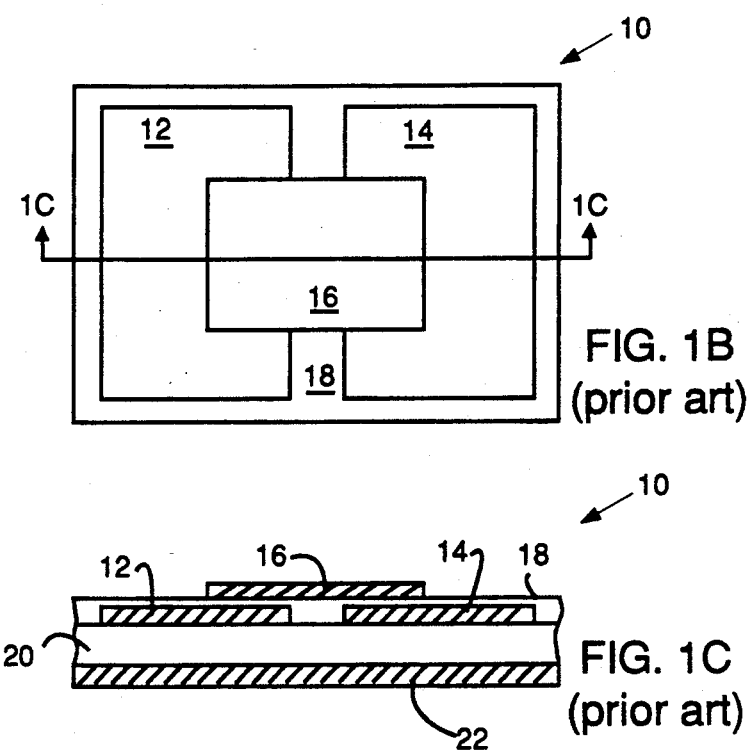
FIG. 1B
(prior art)
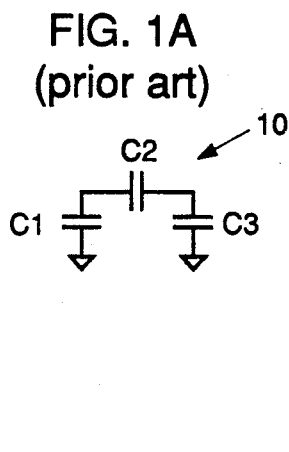
FIG. 1A
(prior art)
FIG. 1C
(prior art)
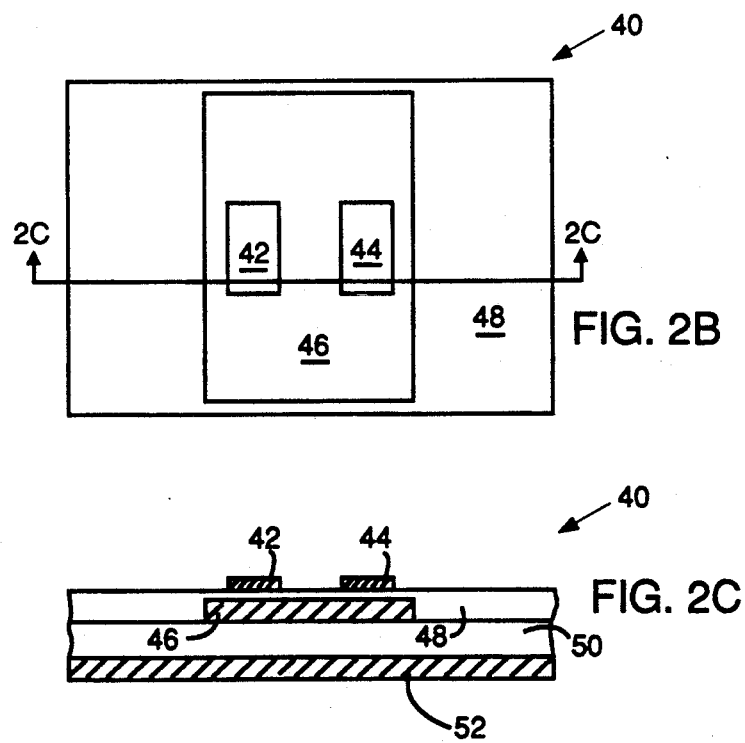
FIG. 2B
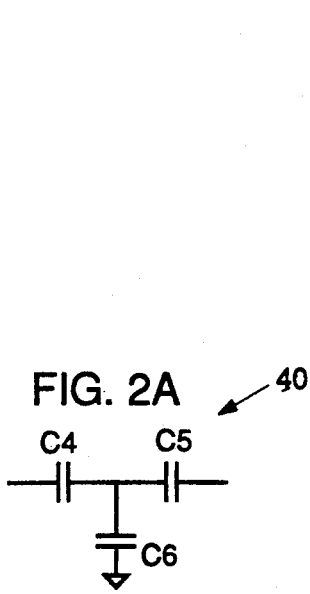
FIG. 2A
FIG. 2C

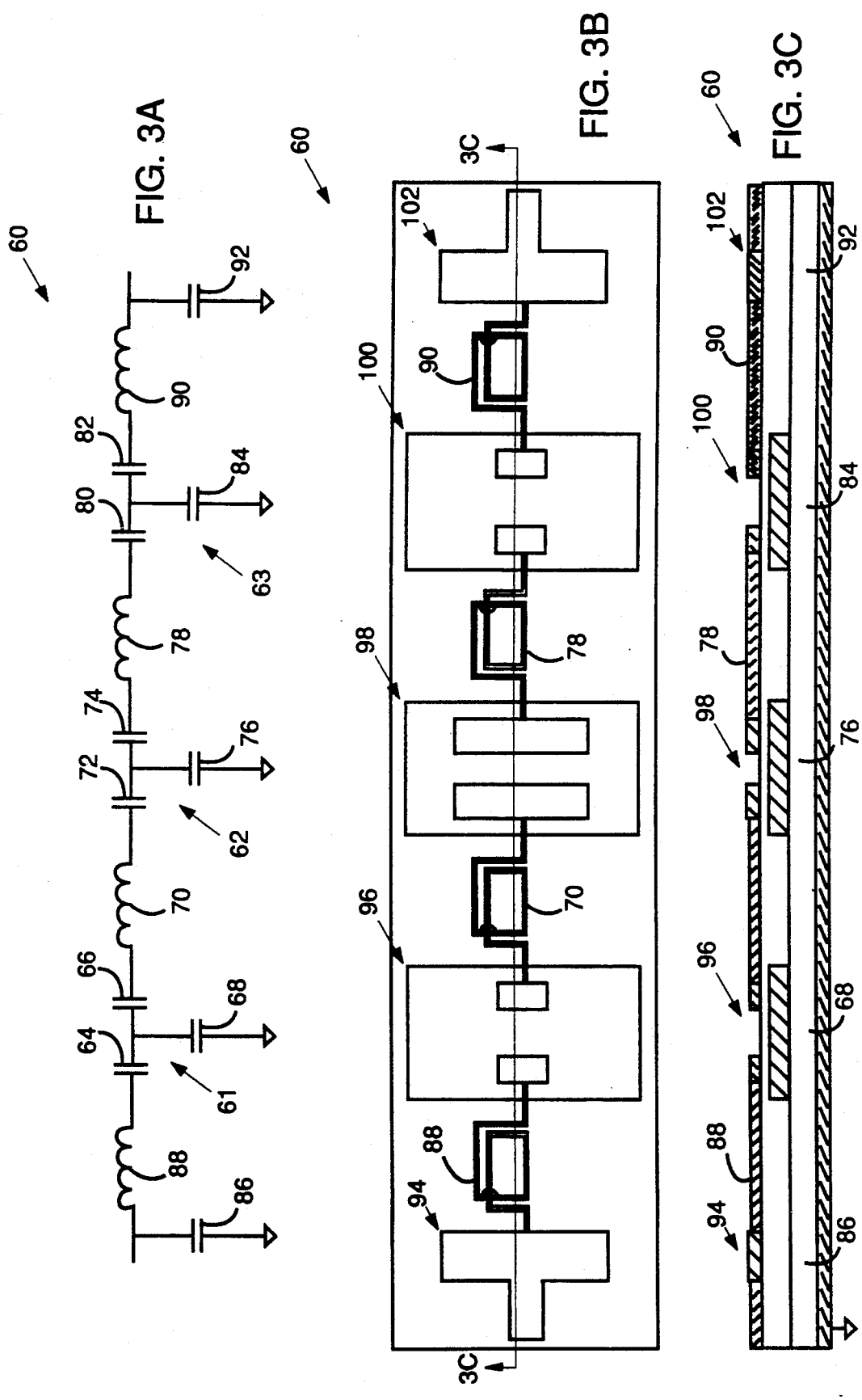

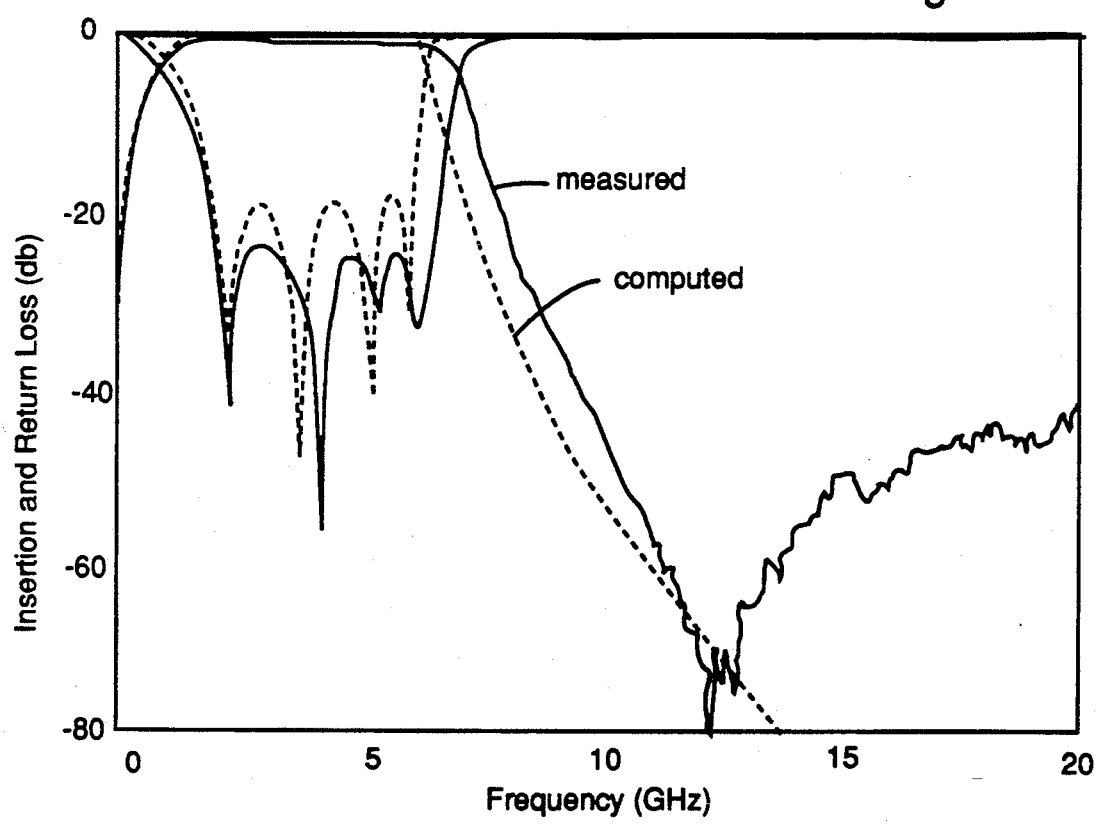
Fig. 4 — 2 - 6 GHz Bandpass Filter

WIDE PERCENTAGE BANDWIDTH MICROWAVE FILTER NETWORK AND METHOD OF MANUFACTURING SAME

BACKGROUND OF THE INVENTION

1. Field of the Invention

The invention relates generally to microwave equipment and more specifically to using capacitive T-networks implemented with thin film methods.

2. Description of the Prior Art

Networks of capacitors and inductors can be used in various microwave applications to make bandpass filters. FIG. 1A shows a typical capacitor pi-network (so-called because its configuration resembles the Greek letter $\pi$) in narrow bandwidth filters. A convenient measure of bandwidth is the percentage bandwidth (% BW), which is:

$$\% \ BW = \frac{f_2 - f_1}{f_0}$$

where $f_0$ is the center frequency, $f_1$ is the lower cutoff frequency, and $f_2$ is the upper cutoff frequency.

A typical implementation of such a pi-network 10 is shown in FIGS. 1B and 1C. Pi-network 10 comprises metal plates 12, 14, and 16 separated by a polyamide layer 18 on an alumina substrate 20 having a groundplane 22. Capacitor C1 is formed between metal plate 12 and groundplane 22. Capacitor C3 is formed between metal plate 14 and groundplane 22. Capacitor C2 is actually two capacitors formed by metal plates 12 and 16, for one of the series capacitors, and metal plates 16 and 14, for the other. Such a network is described in U.S. Pat. No. 4,881,050, issued Nov. 14, 1989 to Swanson, Jr. There, a filter is fabricated from a planar dielectric substrate having a ground plane on one side and two thin-film metal layers and an insulation layer on the other side. The metal and insulation layers are configured to form one or more capacitive pi-networks and spiral inductors, which are electrically interconnected to form the filter.

In order to increase the % BW, capacitors C1 and C3 must be made smaller and capacitor C2 must be made bigger. The sizes of the plate areas, dielectric thickness, and dielectric materials used can all be adjusted to manipulate the values of the capacitors, but practical limits are reached at even modest %BW figures. The problem, traditionally, with microwave filters has been the very limited dynamic range of element values. (Which is not a problem at lower frequencies because discrete capacitors and inductors can be used.) The prior art solutions have usually centered on coming up with clever topologies to get around those restrictions.

SUMMARY OF THE PRESENT INVENTION

It is therefore an object of the present invention to produce a microwave filter that has a wide percentage bandwidth.

Briefly, a preferred embodiment of a filter network of the present invention comprises a T-network of capacitors implemented with thin-film techniques by applying a groundplane to one side of an alumina substrate and a first plate to the other side. A silicon nitride dielectric layer having a high density of capacitance is deposited over the first plate, and then a second and third capacitor plate is deposited on the dielectric over the first plate.

An advantage of the present invention is that bandwidths greater than thirty percent can be practically implemented using thin-film techniques.

Another advantage of the present invention is that parasitic capacitances are reduced.

These and other objects and advantages of the present invention will no doubt become obvious to those of ordinary skill in the art after having read the following detailed description of the preferred embodiments which are illustrated in the various drawing figures.

IN THE DRAWINGS

FIG. 1A is a schematic circuit of a prior art capacitor pi-network;

FIG. 1B is a top view of a prior art thin-film implementation of the circuit of FIG. 1A;

FIG. 1C is a cross-sectional view of the structure of FIG. 1B taken along the lines 1C—1C;

FIG. 2A is a schematic circuit of a capacitor T-network embodiment of the present invention;

FIG. 2B is a top view of a thin-film implementation of the embodiment of FIG. 2A;

FIG. 2C is a cross-sectional view of the structure of FIG. 2B taken along the lines 2C—2C;

FIG. 3A is a schematic circuit of a 2-6 GHz bandpass filter representing an alternative embodiment of the present invention;

FIG. 3B is a top view of the filter of FIG. 3A; and

FIG. 3C is a cross-sectional view of the structure of FIG. 3B taken along the lines 3C—3C; and FIG. 4 is a graph of the bandpass characteristics that were calculated and measured for the filter in FIG. 3A.

DETAILED DESCRIPTION OF THE PREFERRED EMBODIMENTS

An embodiment of the present invention is a T-network (of capacitors) 40, illustrated in FIGS. 2A-2C, and comprises three capacitors illustrated symbolically as C4-C6 and made from a first and a second plate 42 and 44, and a third plate 46, a dielectric layer 48, an alumina substrate 50, and a groundplane 52. Substrate 50 can be made of alumina, beryllium oxide, aluminum nitride, quartz, sapphire, or any other suitable microwave substrate. All can give acceptable results. First and second plates 42 and 44, and third plate 46 can be gold deposited, such as by sputtering. Dielectric layer 48 preferably comprises silicon nitride, as opposed to the polyamide of layer 18 (FIGS. 1B-1C). The silicon nitride layer typically has a density of capacitance of 0.1 picofarad (pfd) per square mil, versus 0.005 pfd per square mil for the polyamide layer, such as in Swanson, Jr., supra. (The density, of course, also depends on the thickness used.) Chemical vapor deposition (CVD) can be used to deposit layer 48 on substrate 50. Capacitor C4 is formed between plates 42 and 46. Capacitor C6 is formed between plate 46 and groundplane 52. Capacitor C5 is formed between plates 44 and 46. The differences in the thicknesses and dielectric materials in layer 48 and substrate 50 allow plate 46 to be made with a relatively large area that can effectively shield capacitors C4 and C5 from having stray (parasitic) capacitances to groundplane 52. Therefore, an important advantage of the present invention is that parasitic capacitances are reduced, and actual filter characteristics more closely adhere to the predicted results. Preferably, the physical orientations of the metal plates are such that they take advantage of the differences in the dielectrics.

FIG. 3A-3B illustrate a 2-6 GHz bandpass filter 60, according to an alternative embodiment of the present invention. A plurality of three capacitive T-networks 61, 62, and 63 with appropriate interconnecting inductors and input/output capacitors are included. The network 61 includes a combination of three capacitors 64, 66, and 68 with the capacitor 68 extending between the groundplane and the junction of capacitor 64 and 66. An inductor 70 interconnects the networks 61 and 62. Network 62 includes a combination of three capacitors 72, 74, and 76 with the capacitor 76 extending between the groundplane and the junction of capacitors 72 and 74. An inductor 78 interconnects the networks 62 and 63. Network 63 includes a combination of three capacitors 80, 82, and 84 with the capacitor 84 extending between the groundplane and the junction of capacitors 80 and 82. Network 61 includes a combination of series capacitors 64 and 66, and are 6.5 pF, which is much larger electrically than capacitor 68 at 751 femtofarads (fF). Inductor 70 is 2.8 nanohenries (nH) and couples T-network 61 to T-network 62. Series capacitors 72 and 74 are 54 pF and much larger electrically than capacitor 76 at 774 fF. Capacitor 86 is 369 femtofarads, inductor 88 is 2.25 microhenries ($\mu$H) and
couples capacitor 86 to T-network 61. Implementation of the respective T-networks 61, 62, and 63 (FIG. 3B) are similar to that shown for network 40 in FIGS. 2B-2C. The sizes of the respective plates for each capacitor are adjusted to result in the above exemplary values. All the inductors, e.g., inductors 70 and 78, have more than one turn. But since these inductors are primarily implemented in a flat two-dimensional surface, wire bonds, or metal bridges are needed to connect the two halves of the inductor. The advantage of using via holes and connecting them with a metallization is that the whole device can be fabricated using thin-film techniques and additional assembly labor is eliminated.

In FIG. 3A, capacitor 86 is implemented by a structure 94 in FIG. 3B. Capacitors 64, 66, and 68 are implemented by a structure 96 in FIG. 3B. Capacitors 72, 74, and 76 are implemented by a structure 98 in FIG. 3B. Capacitors 80, 82, and 84 are implemented by a structure 100. Capacitor 92 is implemented by a structure 102.

A method of fabricating the above thin-film microwave filter comprises depositing a groundplane and first metal plate on an alumina substrate, depositing a silicon nitride dielectric layer on the metal first plate, and depositing second and third metal plates on the dielectric layer such that a T-network of capacitors is formed by the first through third metal plates. The majority of the inductor metalization is in the same layer as plates 42 and 44. The two halves of the inductor can be connected by forming vias through the silicon nitride dielectric and an underpass using metal in the same layer as plate 46. (Here the connection technology is an underpass, in the polyamide type of prior art device the connection technology typically used is an overpass.)

An advantage of the present invention is that bandwidths greater than thirty percent can be practically implemented using thin-film techniques. FIG. 4 shows the bandpass characteristics that were calculated and then measured for filter 60. Low insertion loss and equiripple return loss are obtained between two and six gigahertz (100% BW).

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A thin-film microwave filter including at least one stage, each stage comprising:
   a substrate including a groundplane on a first side and a first metal plate on a second side that is opposite to said first side;
   a dielectric layer deposited over said first metal plate on said second side of the substrate;
   a T-network of capacitors formed by a second and a third metal plate each on the dielectric layer and each entirely within an area defined by projecting the boundaries of said first metal plate normal to the groundplane wherein said first metal plate shields said second and third metal plates from said groudplate; and
   at least one inductor formed primarily on the dielectric layer and connected to the T-network of capacitors.

2. The filter of claim 1, wherein:
   the substrate comprises a material selected from the group consisting of alumina, beryllium oxide, alumina nitride, quartz, and sapphire.

3. The filter of claim 1, wherein:
   the dielectric layer comprises silicon nitride.

4. The filter of claim 1, wherein:
   the T-network of capacitors are such that the filter has a percentage bandwidth that exceeds thirty percent.

5. A method of fabricating a thin-film microwave filter, comprising the steps of:
   depositing a groundplane on a first side of an alumina substrate;
   depositing a first metal layer on a second side of said alumina substrate and forming said first metal layer into at least one metal plate and at least one metal jumper;
   depositing a silicon nitride dielectric layer over said metal first plate and jumper;
   depositing a second metal layer over said silicon nitride dielectric layer and forming second and third metal plates on said dielectric layer such that a T-network of capacitors is formed among the first through third metal plates; and
   forming at least two portions of an inductor in said second metal layer such that the two portions electrically connected to said first metal layer through said metal jumper to operate as an inductor and electrically connected to said T-network of capacitors.

6. The method of claim 5, further comprising the step of:
   forming via holes to said first layer metal jumper to complete inductors formed primarily in said second metal layer such that multi-turn inductors are formed.

* * * * *